US006885211B1

(12) United States Patent
Thomsen et al.

(10) Patent No.: US 6,885,211 B1
(45) Date of Patent: Apr. 26, 2005

(54) INTERNAL NODE OFFSET VOLTAGE TEST CIRCUITS AND METHODS

(75) Inventors: Axel Thomsen, Austin, TX (US); Sherry Wu, Austin, TX (US); Murari Kejariwal, Austin, TX (US); Ammisetti Prasad, Austin, TX (US); John Laurence Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 132 days.

(21) Appl. No.: 10/117,374

(22) Filed: Apr. 5, 2002

(51) Int. Cl.[7] .................................... G01R 31/26
(52) U.S. Cl. .................................... 324/765; 324/158.1
(58) Field of Search .................................... 324/765, 754, 324/158.1, 758, 427, 763, 769; 714/733, 734, 735, 719, 720, 724; 438/14–18

(56) References Cited

U.S. PATENT DOCUMENTS 5,184,162 A * 2/1993 Saitoh et al. ............ 324/158.1
5,861,774 A * 1/1999 Blumenthal .................... 330/2
6,483,338 B1 * 11/2002 Weng et al. ................ 324/765
6,504,394 B1 * 1/2003 Ohlhoff ...................... 324/765

* cited by examiner

*Primary Examiner*—Nestor Ramirez
*Assistant Examiner*—Jimmy Nguyen
(74) *Attorney, Agent, or Firm*—Thompson & Knight LLP; James J. Murphy

(57) ABSTRACT

A method of testing an integrated circuit includes setting a guardbanded limit for a parameter associated with an embedded node, a deviation from the guardbanded limit under a set of test conditions correlated with a failure of the integrated circuit across a range of operating conditions. A test is performed under the test conditions to detect deviations of the parameter from the guardbanded limit to detect failures of the integrated circuit over the range of operating conditions.

23 Claims, 3 Drawing Sheets

INTERNAL NODE OFFSET VOLTAGE TEST CIRCUITS AND METHODS

FIELD OF INVENTION

The present invention relates in general to integrated circuits and in particular to internal node offset voltage test circuits and methods.

BACKGROUND OF INVENTION

Testing integrated circuits typically involves the evaluation of important parameters at various functional levels under differing operating conditions, such as temperature. For example, the overall operation of the chip may be tested in addition to the specific testing of particularly critical circuits or circuit blocks. This is especially important with respects to complex integrated circuits where the overall device functionality may fall within specifications but the functioning of one or more internal circuit blocks is nonetheless only marginal.

The actual implementation of an efficient test protocol for a given chip is a non-trivial task subject to many variables. Among other things, if on-chip test circuitry is to be used, that test circuitry must be non-invasive. In other words, the operation of the test circuitry should not in itself alter any of the critical operating parameters of the device or disturb a critical signal path. Additionally, depending on packaging limitations, it is not always practical to provide sufficient pins for observing all the internal circuits requiring test. Further, notwithstanding the problem of access, some means must be provided to trigger the internal circuitry test mode. Finally, but of no less importance, some decision must be made as to which parameters and nodes are to be tested.

Given the importance of testing at various functional levels of an integrated circuit, improved testing techniques are required. These techniques should be non-invasive, neither disturbing critical signal paths nor dictating undue changes in the physical configuration device or packaging. They should be flexibly amenable to the testing of various internal nodes on the integrated circuit in a cost- and time-efficient fashion.

SUMMARY OF INVENTION

The principles of the present invention are embodied in circuits and methods for verifying the operation of internal blocks of an integrated circuit across a range of operating conditions. In one embodiment, A method of testing an integrated circuit is disclosed including the step of setting a guardbanded limit for a parameter associated with an embedded node, a deviation from the guardbanded limit under a set of test conditions correlated with a failure of the integrated circuit across a range of operating conditions. A test is performed under the test conditions to detect deviations of the parameter from the guardbanded limit to detect failures of the integrated circuit over the range of operating conditions.

The principles of the present invention provide techniques for testing internal nodes in a non-invasive yet efficient manner. Specifically, a set of tests is described which allows borderline internal stages to be identified by observing offset voltages between differential stages and the effects such offset voltages have on the device's performance. One advantage of the set of tests is the elimination of the requirement that a large matrix of tests be performed to verify a varied number of operational conditions.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–8 of the drawings, in which like numbers designate like parts.

Figure 1:
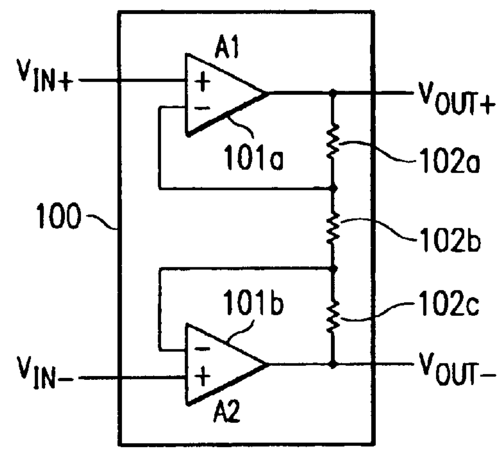
FIG. 1 is a functional block diagram of a multipath feedforward differential amplifier embodying the present inventive principles.

FIG. 1 is a functional block diagram of a feed-forward differential amplifier 100, fabricated on a single chip, and embodying the principles of the present invention. (Amplifier 100 is only one of a number of possible applications of these principles, which are particularly useful in instances where testing of deeply embedded circuits is required.)

Amplifier 100 is based on a pair of differential-input, single-ended operational amplifiers 101*a,b* (A1 and A2) which will be described in further detail below. Each amplifier 101 receives at its non-inverting (+) input a corresponding one of the differential input signal pair $V_{In+}$ and $V_{In-}$ and drives a corresponding differential output signal pair $V_{Out+}$ and $V_{Out-}$. A network of resistors 102*a,c* generates the feedback voltages to the amplifier 101 inverting (−) inputs.

Figure 2:
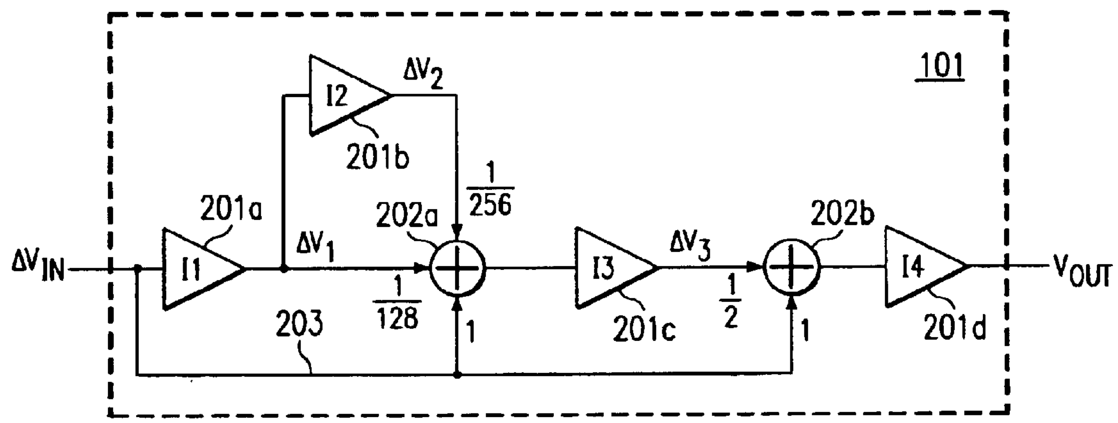
FIG. 2 is a more detailed functional block diagram of a selected one of the differential amplifiers shown in FIG. 1.

In the preferred embodiment, each amplifier 101*a,b* is a multiple-stage device such as that shown in FIG. 2. In the illustrated embodiment, four differential integrator stages (I1, I2, I3, I4) 201*a,d*, coupled by summers 202*a,b*, form the low-frequency path. The exemplary weighted outputs from integrator stages 201 into summers 202 are shown in FIG. 2 for reference. The amplifier high frequency path is shown by the feedforward loop 203.

In multiple-stage devices, an excessive output from one stage can overdrive one or more of the following stages in the signal path thereby deteriorating overall device performance. In the specific case of an operational amplifier with multiple internal amplifier stages, such as feedforward amplifiers 101*a,b*, an overly large offset at the output of a failed stage will overdrive the following stages. This will result in a measurable increase in noise and harmonic distortion at the outputs of amplifier 100. (In the preferred embodiment, summers 202 are designed such that the following integrator stages I3 and I4 will not saturate, even if one or more of the prior stages such as integrator stage I2 has failed, although the DC gain will be reduced. Stages such as I2 which are not preceded by a summer may however saturate when its inputs are overdriven, for example due to a failure of integrator stage I1.)

The problem of failing internal stages is compounded by the fact that "borderline" stages may operate properly under nominal operational conditions yet fail when those conditions change. For example, a given stage in the chain may produce a differential output within the maximum allowable voltage swing at nominal temperature but exceed that voltage swing with temperature change, resulting in the overdrive of the following stage.

With respects to operational amplifiers 101*a,b*, in order to obtain optimum performance all stages 201 should be operating in an active non-saturation state. As previously noted, in a multipath feedforward configuration the internal amplifier (integrator) stages are bypassed by a high frequency path. In order to insure large signal stability at start-up and during transients, the high frequency path prevails as the stronger path. During normal operation, the input offset of a given stage, for example integrator I4, is compensated for by the preceding low frequency path integrator, in this case integrator I3. The voltage drive required by stage I3 to compensate for the input offset voltage of following stage I4 is a function of the intervening summer 202. In particular, the output weight from integrator I3 into summer 202*b* is ½ and therefore integrator I3 must be capable of providing a minimum drive voltage at least twice as large as the input offset of integrator I4 in order to compensate. At the same time, the maximum input voltage swing $\Delta V_{Max}$, which a given stage, in this case I4 properly operates, is limited by the choice of transistor sizes and bias currents. Moreover, $\Delta V_{Max}$ will also vary as a strong function of temperature and a weak function of the common mode and power supply voltages.

Consequently, to determine if the output stage of one integrator stage will overdrive the differential inputs of the following stage, a large matrix of temperature, common mode voltage, power supply voltage and similar factors would normally have to be tested. To do so however would be prohibitively expensive in time, monetary costs and added circuit complexity. The present inventive concepts on the other hand provide means by which a single measurement can be made for a particular temperature and performance predicted for the general case.

Figure 3:
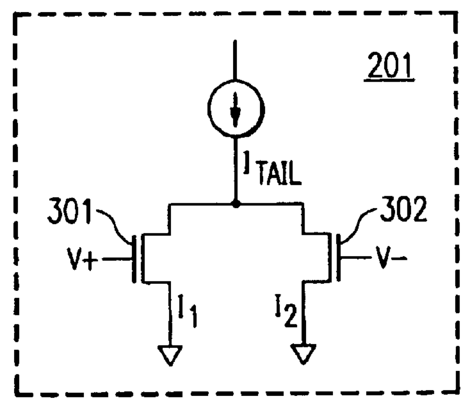
FIG. 3 is a conceptual model of a selected one of the integrator stages of FIG. 2 suitable for described the relationship between the corresponding input voltages and resulting tail current.

FIG. 3 is a conceptual model of one of the integrator stages 201 where $V_+$ and $V_-$ are the differential input signals to the given amplifier stage and $I_{TAIL}$ is the tail current into the differential current paths $I_1$ and $I_2$. The maximum values of V+ and V− are strong functions of the tail current $I_{TAIL}$ and the size of (channel width and length) input transistors 301 and 302 and weak functions of the supply voltage of the source of the tail current and the common mode voltage $V_+ - V-$. It will be assumed that exceeding some value of $V_{+max}$ or $V_{-max}$ will overdrive the inputs and cause the stage to saturate and/or measurably reduce the DC gain.

Figure 4:
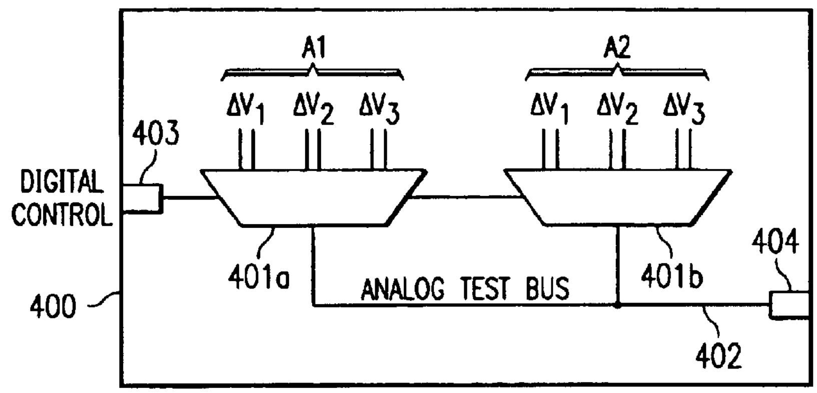
FIG. 4 is a functional block diagram of an exemplary test architecture suitable for practicing the inventive concepts.
Figure 5:
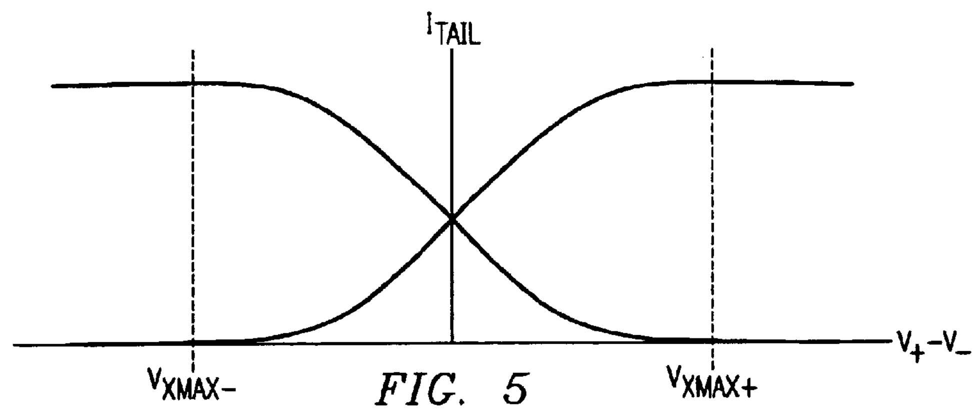
FIG. 5 is a plot of the differential input voltage versus tail current for a selected integrator stage of FIGS. 2 and 3.

FIG. 4 illustrates a preferred test architecture 400, which allows various internal (embedded) nodes within each amplifier A1 and A2 to be monitored. An "embedded node" is one which is typically not observable during normal device operation, although an out-of-specification parameter or state variable associated with that node under given conditions nonetheless results in an out-of-specification (failure) condition of the overall device (in this example amplifier 100). In the illustrated embodiment, the internal differential output voltage $\Delta V_x$ ($V_{XOUT+} - V_{XOUT-}$) from a selected integrator stage $I_x$, where x is the integrator stage number, for a given amplifier A1 or A2, is passed to internal analog test bus 402. Signal selection is performed by multiplexers 401*a,b* under the control of a digital control signal input to amplifier 100 through digital serial port or pin 403. The selected analog signal is output through analog test port or pins 404.

In a first test, the inputs $V_{In+}$ and $V_{In-}$ to amplifier 100 are tied together. The measurement of $\Delta V_X$ for each stage $I_X$ and each amplifier A1 and A2 for at single test temperature is then compared against a guardbanded-offset voltage $\Delta V_{Xguard}$ to determine if stage $I_X$ has failed.

Specifically, the guardbanded maximum value for $\Delta V_{Xguard}$ is statistically determined as strong functions of temperature and input transistor device size and weak functions of supply and common mode voltages. In other words, the guardbanded voltage $\Delta V_{Xguard}$ is the approximate maximum offset voltage that will not overdrive following integrator stage $I_{X+1}$ under all operating conditions, taking into account the weighting through the intervening summer stages. For example, assume that the output voltage $\Delta V_{X1}$ from Stage X will just begin to saturate Stage X+1 under nominal test conditions (e.g. temperature, bias current, common mode voltage, process variation) while an output voltage $\Delta V_{X2}$ will saturate Stage X+1 under a second statistically or experimentally determined set of conditions. Then the guardbanded voltage $\Delta V_{Xguard}$ is selected to be within the window of $\Delta V_{X2}$ such that when a single measurement is made under nominal test conditions, potential failures under the second set of conditions are also detected. This is illustrated graphically in FIG. 5, where $\Delta V_{X1}$ is the difference between $V_{MAX+1}$ and $V_{MAX-1}$, $\Delta V_{X2}$ is the difference between $V_{XMAX+2}$ and $V_{MAX-2}$, and the guardband window $\Delta V_{Xguard}$ is the difference between $V_{Xguard+}1$ and $V_{Xguard-}$.

Figure 6A:
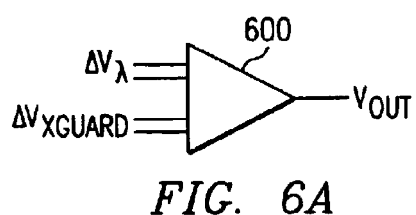
FIGS. 6A and 6B illustrate window comparator technique for monitoring the differential voltages shown in FIG. 4.
Figure 6B:
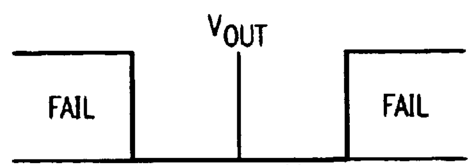

This test feature can be supplemented by a window comparator or similar error detection circuit 600 monitoring each voltage $\Delta V_x$. An exemplary differential window comparator is shown in FIG. 6A and the corresponding test limits in FIG. 6B. In this case, a single pass/fail flag can be switched to the analog test output pins through multiplexers.

Figure 7:
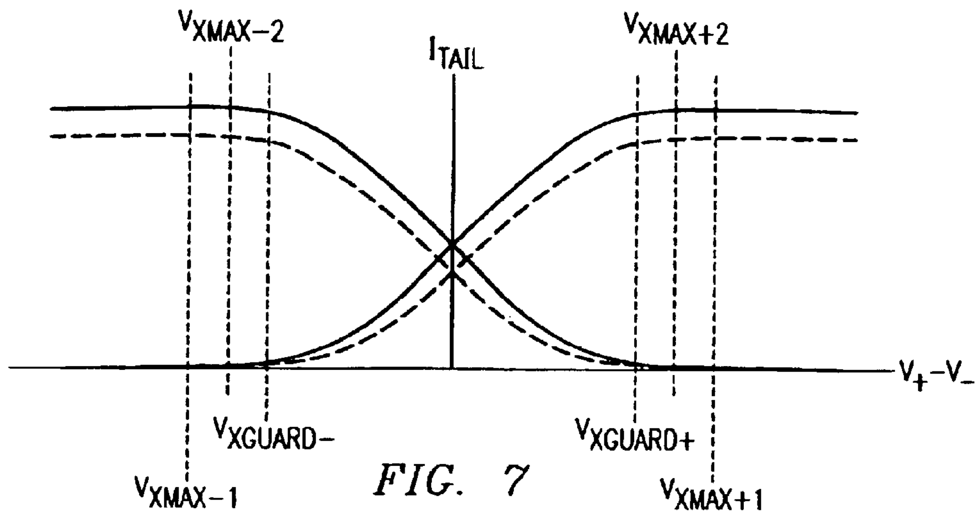
FIG. 7 is a plot of the differential input voltage versus tail current for a selected integrator stage of an embodiment of the inventive principles wherein the tail current is step to test for internal failures.

Another test technique according to the inventive principles is illustrated in FIG. 7. Again amplifier 100 inputs $V_{In+}$ and $V_{In-}$ are tied together. Here, however, the tail current to each of the integrator stages 201 is stepped down under digital control. In FIG. 7, the fixed normal operating tail current for a given integrator stage is shown by solid lines and the stepped-down test currents by dashed lines. With a decreased tail current, the maximum offset voltage to the stage which will not cause the inputs of that stage to be overdriven are also reduced. When one or more of the preceding stages is borderline, its output offset voltage will overdrive the reduced input voltage levels of the following stage such that measurable changes in the voltage offset, noise and/or total harmonic distortion at amplifier 100 outputs $V_{OUT+}$ and $V_{OUT-}$ can be observed.

Figure 8A:
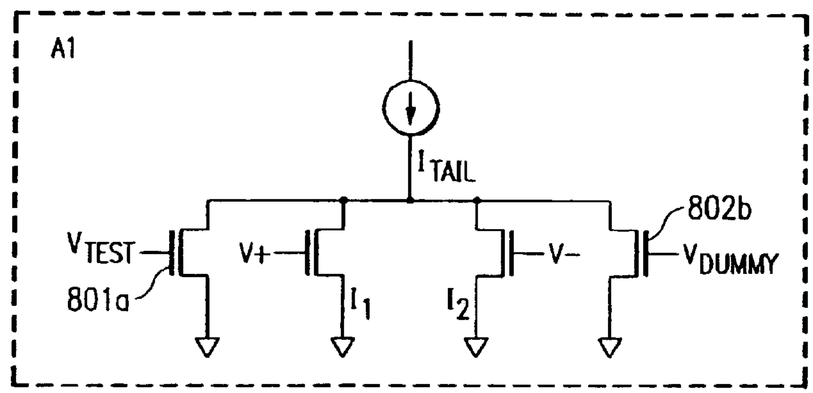
FIGS. 8A and 8B are functional block diagrams of the amplifiers of FIG. 1 in an embodiment of the present principles wherein an offset current is injected to test for internal failures.
Figure 8B:
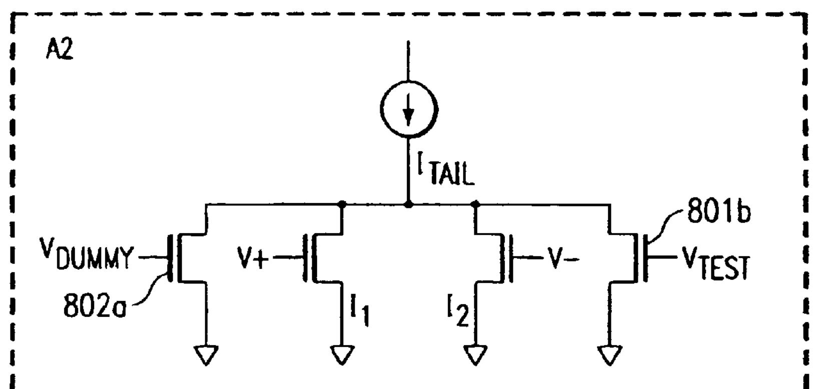

Another embodiment of the present principles is illustrated in FIGS. 8A and 8B, which are conceptual models of amplifiers A1 and A2. In each case, a test path 801*a,b* is provided on opposing differential primarily signal paths to inject an offset current. A dummy load 802*a,b* is also provided for balance. The offset current injection is preferably implemented at the output the first integrator stage I1 of each amplifier A1 or A2, although this is not a requirement of practicing the inventive concepts. The inputs $V_{In+}$ and $V_{In-}$ to amplifier 100 are tied together and the offset at the outputs $V_{OUT+}$ and $V_{OUT-}$ of differential amplifier 100 is then observed. If amplifier 100 is operating properly, the injected offset current will be compensated for in the following stages. On the other hand, if one of the integrator stages is borderline, the injected current will cause that stage to be overdriven. Again the failure can be observed at the amplifier 100 outputs as increased offset as well as in an increase, noise and/or distortion.

In sum, the present concepts advantageously provide circuits and methods for efficiently testing internal stages of an integrated circuit. In particular, these circuits and methods provide for the testing of offset voltages at selected points within a device, such as between integrator stages in a feedforward multiple-integrator differential amplifier. From these offset voltages and changes thereto, failed states whose outputs will overdrive the following stages under selected test conditions can be detected. Moreover, these offset voltages can be tested without having to resort to a large matrix of temperature, common mode voltage and power supply voltage test conditions.

Although the invention has been described with reference to specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed might be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed is:

1. An integrated circuit comprising a circuit block including an embedded node, a parameter at the embedded node falling outside a predetermined range under given operating conditions corresponding to a failure of said integrated circuit comprising:

circuitry for observing the parameter at the embedded node under test conditions for comparison against a guardbanded range, said guardbanded range selected to detect failures of said integrated circuit across a range of possible operating conditions.

2. The integrated circuit of claim 1 wherein said circuitry for observing comprises:

an analog test bus coupled to an output of said integrated circuit; and a multiplexer for selectively coupling said circuit block to said analog test bus.

3. The integrated circuit of claim 1 wherein said circuitry for observing comprises a window comparator circuit for comparing a voltage at the embedded node with a guardbanded voltage range and selectively generating a flag for output from said integrated circuit in response.

4. The integrated circuit of claim 1 wherein said circuit block comprises an amplifier.

5. The integrated circuit of claim 4 wherein said parameter comprises a differential voltage and said guardbanded range comprises a differential voltage window.

6. The integrated circuit of claim 1 wherein said circuit block comprises a first one of first and second circuit blocks coupled in series and said parameter at said embedded node comprises an output voltage from said first circuit block, said guardbanded range selected to detect an output voltage from the first circuit block overdriving an input of the second circuit block over the range of possible operating conditions.

7. The integrated circuit of claim 1 wherein the first and second circuit blocks comprise integrator stages forming an differential amplifier.

8. An integrated circuit comprising an amplifier stage, the amplifier stage overdriven and causing a failure of the integrated circuit when a voltage at an embedded node exceeds a level corresponding to a tail current supplied to the amplifier stage under a set of operating conditions comprising:

circuitry for selectively varying the tail current to the amplifier stage under test conditions to detect voltages at the embedded node exceeding the corresponding level to detect failures of the integrated circuit across a range of operating conditions.

9. The integrated circuit of claim 8 wherein said amplifier stage comprises a first one of first and second amplifier stages and the embedded node is disposed between output of the first amplifier stage and an input of the second amplifier stage.

10. The integrated circuit of claim 9 wherein the first and second amplifier stages are coupled through a summer stage, the summer stage receiving a weighted voltage output from the first amplifier stage and a signal fedforward from an input node.

11. The integrated circuit of claim 8 wherein the first and second amplifier stages comprise a integrator stages.

12. An integrated circuit including a differential amplifier stage having a pair of differential inputs at an embedded node, the amplifier overdriven and causing a failure of the integrated circuit when an offset at the embedded node exceeds a predetermined level comprising:

circuitry for selectively injecting an offset at the embedded node under test conditions, the offset current selected to detect failures of said amplifier stages across a range of operating conditions.

13. The integrated circuit of claim 12 wherein said differential amplifier stage comprises a selected one of a plurality of differential amplifier stages coupled in series.

14. A method of testing an integrated circuit comprising the steps of:

setting a guardbanded limit for a parameter associated with an embedded node, a deviation from the guardbanded limit under a set of test conditions correlated with a potential failure of the integrated circuit across a range of operating conditions; and performing a test under the test conditions to detect deviations of the parameter from the guardbanded limit to detect potential failures of the integrated circuit over the range of operating conditions.

15. The method of claim 14 wherein the selected parameter comprises a voltage and said step of performing a test comprises the substep of:

observing a voltage at the embedded node.

16. The method of claim 15 wherein said substep of observing comprises the further substep of switching the voltage from the embedded node to an output terminal of the integrated circuit via an internal test bus.

17. The method of claim 15 wherein said step of performing a test comprises the substeps of:

reducing a tail current sunk by the internal stage to vary the value of the parameter under the set of test conditions; and observing an output signal of the integrated amplifier circuit.

18. The method of claim 17 wherein said step of performing a test comprises the substeps of:

injecting an offset current to the internal stage to vary the value of the selected parameter under the set of test conditions; and observing an output offset voltage at an output of the integrated circuit.

19. The method of claim 14 wherein the internal stage is a first one of a pair of first and second internal stages and said step of selecting a guardbanded test parameter comprises the step of selecting a guardbanded output voltage for detecting overdrive of the second stage by the output of the first stage over the range of operating conditions.

20. The method of claim 19 wherein said step of selecting comprises the substep of selecting a guardbanded output voltage for detecting overdrive of the second stage in combination with a feedforward signal summed with the output voltage of the selected one of the stages.

21. The method of claim 14 wherein the embedded node comprises an output of an amplifier stage of a multi-stage operational amplifier.

22. An integrated circuit comprising an embedded node, the embedded node associated with a parameter, deviation from a guardbanded limit for the parameter under a set of test conditions correlated with a potential failure of the integrated circuit across a range of operating conditions, comprising:

test circuitry for performing a test of the embedded node under the test conditions to detect deviations of the parameter from the guardbanded limit and thereby detect potential failures of the integrated circuit over the range of operating conditions.

23. The integrated circuit of claim 22 wherein the embedded node comprises an output of an amplifier stage of a multiple-stage operational amplifier.

* * * * *